(12) United States Patent
Matsui et al.

(10) Patent No.: US 8,017,482 B2
(45) Date of Patent: Sep. 13, 2011

(54) METHOD OF MANUFACTURING SEMICONDUCTOR DEVICE

(75) Inventors: Toshikazu Matsui, Ibi-gun (JP);
Yasuyuki Sayama, Anpachi-gun (JP);
Hiroki Eto, Ora-gun (JP); Takumi Hosoya, Isesaki-shi (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/974,819

(22) Filed: Dec. 21, 2010

(65) Prior Publication Data

US 2011/0159651 A1      Jun. 30, 2011

(30) Foreign Application Priority Data

Dec. 24, 2009   (JP) .................................. 2009-292162

(51) Int. Cl.
*H01L 21/336* (2006.01)
(52) U.S. Cl. . 438/270; 438/524; 438/525; 257/E21.382; 257/E21.585
(58) Field of Classification Search .................. 438/259, 438/270, 524, 525, FOR. 494; 257/E21.655, 257/E21.382, E21.585
See application file for complete search history.

(56) References Cited

U.S. PATENT DOCUMENTS

| 5,885,883 | A  | * | 3/1999 | Park et al. ...................... 438/435 |
| 6,921,699 | B2 | * | 7/2005 | Ma et al. ....................... 438/270 |

FOREIGN PATENT DOCUMENTS

JP           2000-349289       12/2000

* cited by examiner

*Primary Examiner* — Matthew Smith
*Assistant Examiner* — Quovaunda V Jefferson
(74) *Attorney, Agent, or Firm* — Morrison & Foerster LLP (57) ABSTRACT

The invention provides a method of manufacturing a semiconductor device at low cost in which the gate insulation film having a trench structure is not damaged by arsenic ions when the emitter layer or the like is formed and the insulation breakdown voltage is enhanced. A gate electrode made of polysilicon formed in a trench is thermally oxidized in a high temperature furnace or the like to form a thick polysilicon thermal oxide film on the gate electrode. Impurity ions are then ion-implanted to form an N type semiconductor layer that is to be an emitter layer or the like. At this time, the polysilicon thermal oxide film is formed thicker than the projected range Rp of impurity ions in the silicon oxide film for forming the N type semiconductor layer as the emitter layer or the like by ion implantation. This prevents a gate insulation film between the gate electrode and the N type semiconductor layer from being damaged by the impurity ions.

5 Claims, 11 Drawing Sheets

FIG.11
PRIOR ART

METHOD OF MANUFACTURING SEMICONDUCTOR DEVICE

CROSS-REFERENCE OF THE INVENTION

This application claims priority from Japanese Patent Application No. 2009-292162, the content of which is incorporated herein by reference in its entirety.

BACKGROUND OF THE INVENTION

Field of the Invention

The invention relates to a method of manufacturing a semiconductor device having a trench gate structure, in particular, to a method of manufacturing a semiconductor device that prevents an insulation breakdown voltage of a gate insulation film of an IGBT or a power MOS transistor from decreasing due to an impact of ion implantation or the like when an emitter layer or the like is formed.

Figure 11:
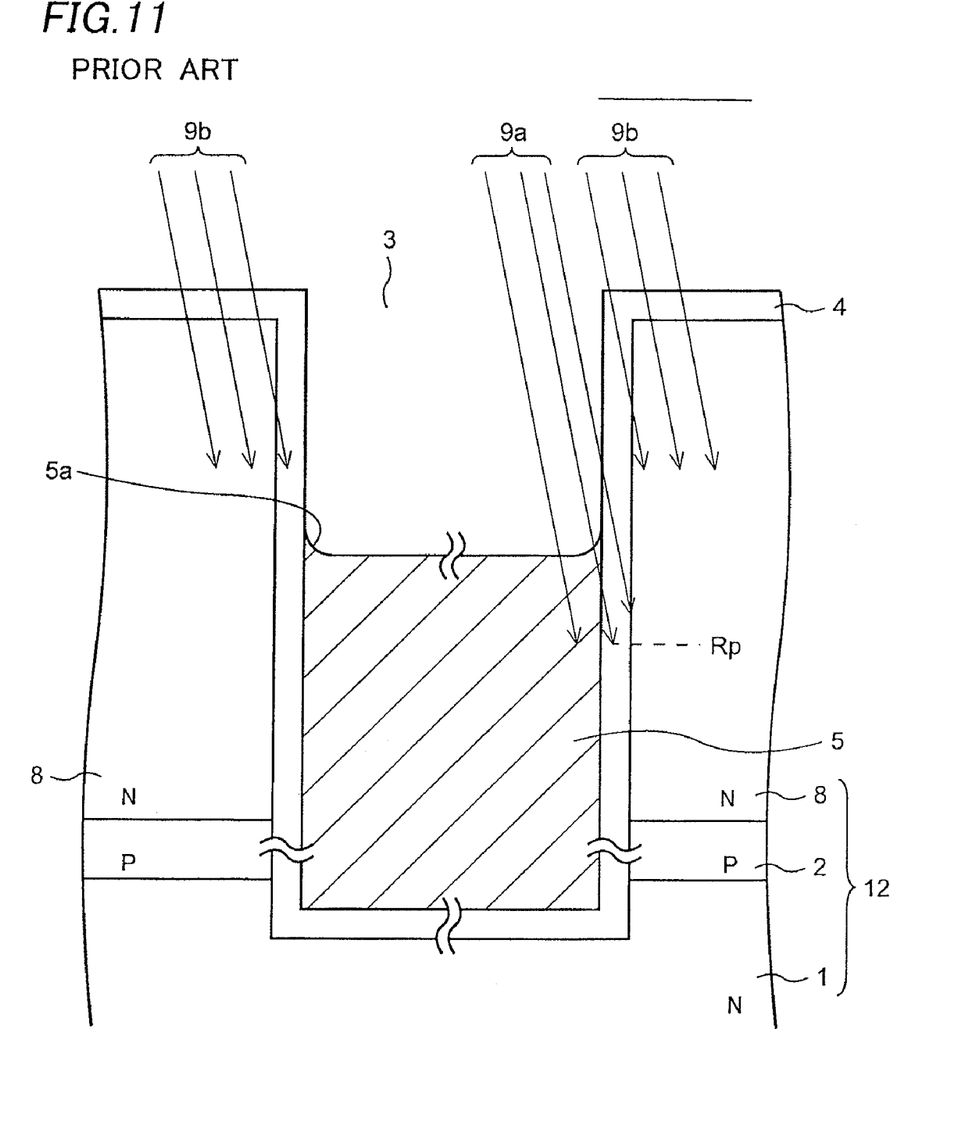
FIG. 11 is a cross-sectional view showing a conventional method of manufacturing a semiconductor device.

A trench gate structure is often used for an IGBT (Insulated Gate Bipolar Transistor) or a power MOS transistor so as to realize lower on-resistance or the like. For obtaining a trench gate structure, as shown in FIG. 11, a semiconductor substrate 12 having an N type semiconductor layer 1 and a P type semiconductor layer 2 is first etched from the front surface to the inside to form a trench 3 in the semiconductor substrate 12. Then a gate insulation film 4 covering the inner sidewall of the trench 3 is formed, and a gate electrode 5 is formed by filling the trench 3 with conductive polysilicon. Impurities such as arsenic ions or the like are then ion-implanted in the front surface of the P type semiconductor layer 2 and further thermally diffused to form an impurity region as an N type semiconductor layer 8 in the P type semiconductor layer 2. The N type semiconductor layer 8 serves as an emitter layer in an IGBT, or serves as a source layer in a power MOS transistor.

As shown in FIG. 11, for forming the N type semiconductor layer 8 in the semiconductor substrate 12, arsenic ions or the like accelerated by high voltage are ion-implanted in directions shown by arrows 9b. Simultaneously, arsenic ions or the like are also implanted in the gate insulation film 4 between the gate electrode 5 and the N type semiconductor layer 8 directly or through the polysilicon layer as the gate electrode 5 in directions shown by arrows 9a. The arrows 9a, 9b respectively show the ranges of arsenic ions or the like, and the ends of these ranges schematically show the positions of the projected ranges Rp of arsenic ions implanted in the silicon oxide film or the like.

Since the arsenic ions or the like implanted in the ranges shown by the arrows 9a in the gate insulation film 4 between the gate electrode 5 and the N type semiconductor layer 8 through the gate electrode 5 made of polysilicon or the like have high energy, the gate insulation film 4 is damaged along the ranges of the arrows 9a. As a result, the film quality of the gate insulation film 4 in these portions decreases and leakage currents flow, causing the insulation breakdown voltage of the gate insulation film 4 to decrease. It is noted that the implantation directions of arsenic ions or the like are oblique to the semiconductor substrate 12 instead of vertical thereto, and this is to prevent the channeling of the arsenic ions or the like in the semiconductor substrate 12.

A method of preventing a gate insulation breakdown voltage of an IGBT or the like having a trench gate structure from decreasing is described in the Japanese Patent Application publication No. 2000-349289.

In Japanese Patent Application publication No. 2000-349289, when an N type semiconductor layer 8 is formed by ion implantation of arsenic ion, a gate electrode 5 formed in a trench 3 is covered with a thick insulation film so as to prevent arsenic ions from entering a gate insulation film 4 between the gate electrode 5 made of polysilicon and the N type semiconductor layer 8. This realizes preventing the gate insulation film from being damaged by the ion implantation.

The method of forming the thick insulation film covering the gate electrode 5 is as follows. First, a silicon oxide film having a thickness of about 1 μm is deposited on the whole surface of a semiconductor substrate 12 including on the gate electrode 5 by a CVD method. The whole surface is then etched back by dry-etching or the like until the front surface of the P type semiconductor layer 2 is exposed. Furthermore, the whole front surface of the semiconductor substrate 12 including on the gate electrode 5 is covered with a screen oxide film having a thickness of about 50 nm so as to prevent the exposed front surface of the P type semiconductor layer 2 from being damaged by the ion implantation.

As described above, in the method described in Japanese Patent Application publication No. 2000-349289, the process of forming the insulation film covering the gate electrode 5 so as to prevent damages by the ion implantation includes complex processes of forming the CVD silicon oxide film, etching back the whole surface of the silicon oxide film, and forming the screen oxide film.

Therefore, a manufacture method that realizes forming an insulation film covering a gate electrode 5 in a simple manner and at low cost is needed.

SUMMARY OF THE INVENTION

The invention provides a method of manufacturing a semiconductor device. The method includes providing a semiconductor substrate having a first semiconductor layer of a first general conductive type and a second semiconductor layer of a second general conductive type disposed on the first semiconductor layer, forming a trench extending from a front surface of the second semiconductor layer into the first semiconductor layer, forming a gate insulation film on an inner sidewall of the trench and the front surface of the second semiconductor layer, forming a gate electrode in the trench after the formation of the gate insulation film, forming a gate electrode protection film on an upper surface of the gate electrode by thermally oxidizing the gate electrode, and forming an impurity region of the first general conductive type by ion-implanting impurity ions in the second semiconductor layer after the formation of the gate electrode protection film.

DETAILED DESCRIPTION OF THE INVENTION

A method of manufacturing a semiconductor device of a first embodiment of the invention will be described referring to FIGS. 1 to 7. The invention relates to a method of manufacturing an IGBT or a power MOS transistor, and the main subject of the invention relates to a manufacture method that prevents a gate insulation film near the uppermost surface of a gate electrode in a trench gate structure from being damaged by ion implantation of arsenic ions or the like for forming an emitter layer or the like. Therefore, the figures mainly show the gate insulation film portion near the uppermost surface of a gate electrode in a trench gate structure.

Figure 1:
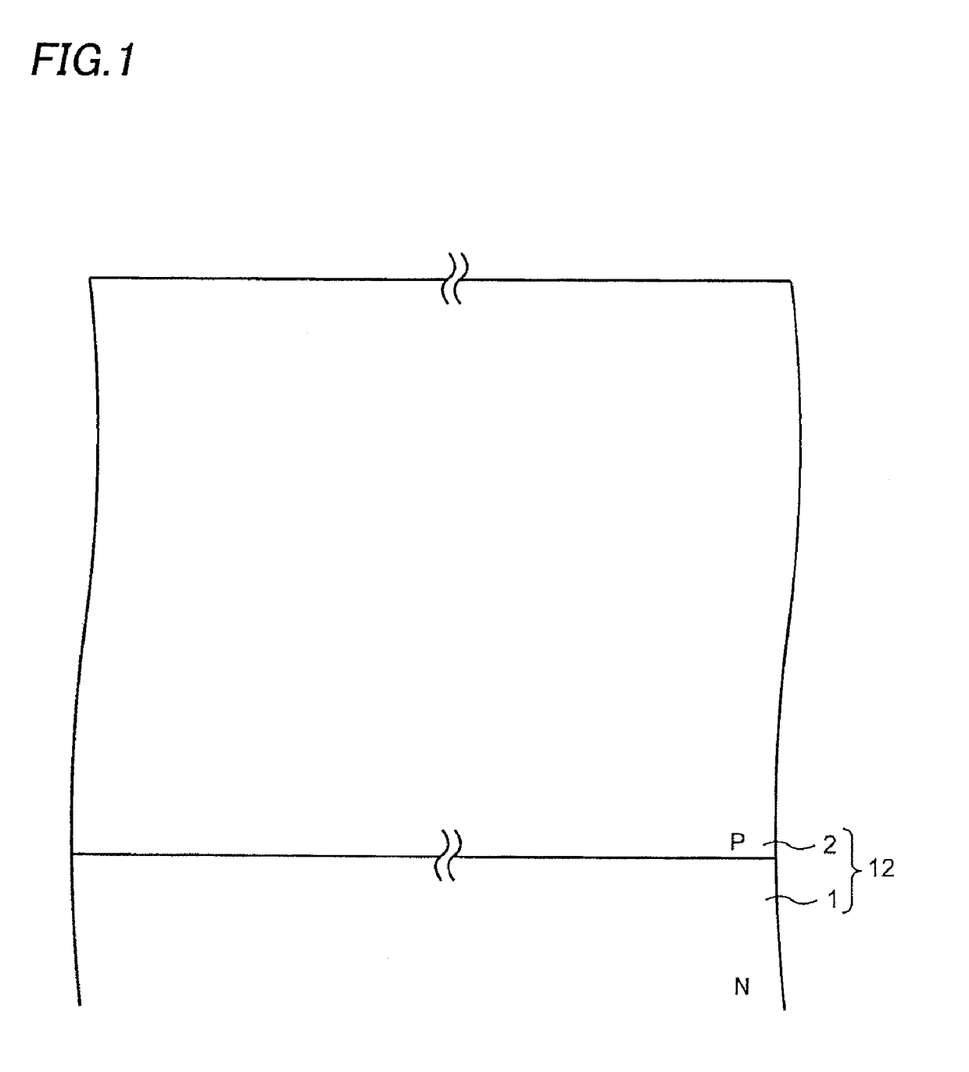
FIGS. 1 to 5 are cross-sectional views showing a method of manufacturing a semiconductor device of a first embodiment of the invention.

First, a semiconductor substrate 12 shown in FIG. 1 is provided in the following manner. First, an N+ type semiconductor substrate (not shown) is provided when a semiconductor device is an N-channel type power MOS transistor, or a P+ type semiconductor substrate (not shown) where an N+ type semiconductor layer (not shown) is formed on the front surface by an epitaxial method or the like is provided when a semiconductor device is an IGBT. The N+ type semiconductor layer is exposed on the front surface of either of the semiconductor substrates. It is noted that the N+ type semiconductor substrate and the P+ type semiconductor substrate of the embodiment are single crystal silicon substrates, and the N+ type semiconductor layer formed by epitaxial growth is also a silicon layer.

Then, as shown in FIG. 1, an N type semiconductor layer 1 having a predetermined thickness is formed on the front surface of the N+ type semiconductor layer by a predetermined epitaxial method. A silicon oxide film (not shown) is then formed on the front surface of the N type semiconductor layer 1, and boron ions are ion-implanted in the N type semiconductor layer 1 through the silicon oxide film. The semiconductor substrate 12 is then put in a high temperature furnace or the like, and the ion-implanted boron is diffused in the N type semiconductor layer 1 to form a P type semiconductor layer 2. The P type semiconductor layer 2 is a region that is to be a channel layer immediately under a gate electrode.

It is noted that conductivity types such as N+, N and N− belong in one general conductivity type and conductivity types such as P+, P and P− belong in the other general conductivity type.

Figure 2:
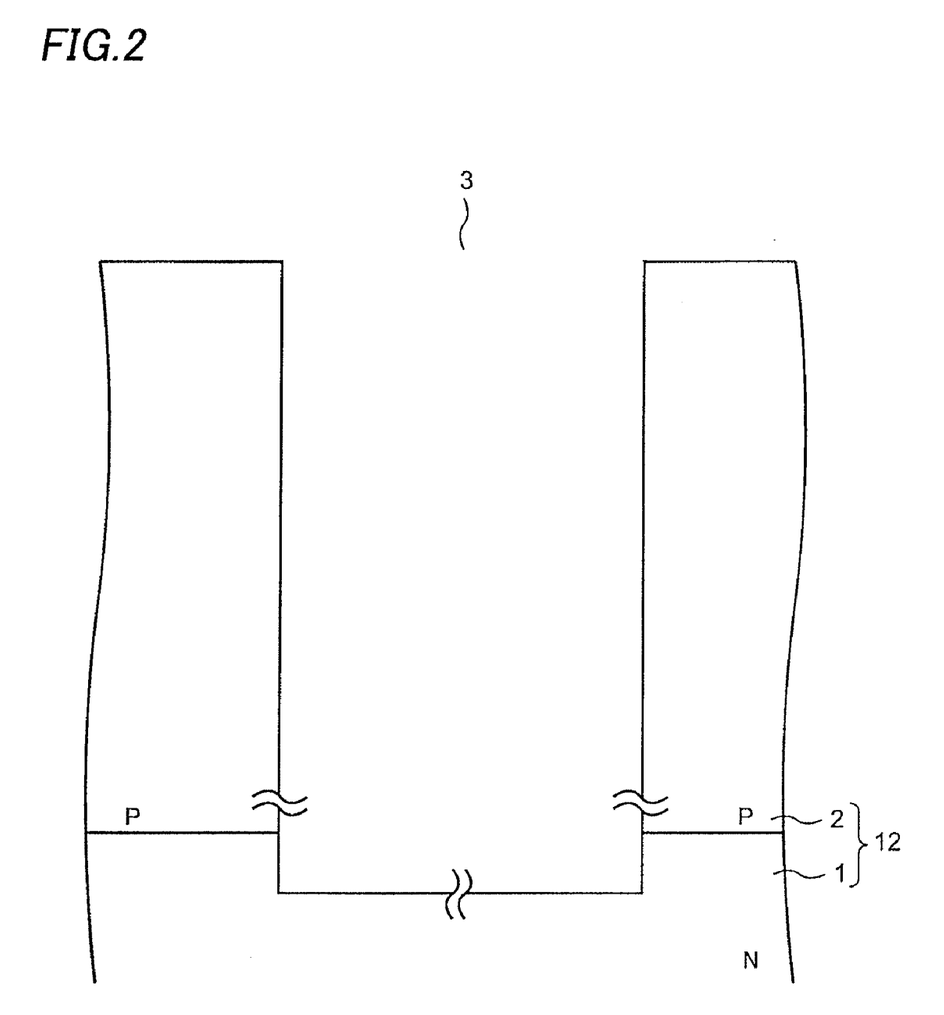

Then, as shown in FIG. 2, a mask made of a silicon oxide film or the like (not shown) is formed by a predetermined process, and a trench 3 having predetermined width and depth is formed by dry-etching or the like using the mask so as to extend from the front surface of the P type semiconductor layer 2 to the inside of the N type semiconductor layer 1. A plurality of trenches 3 are formed, but the figure shows one of these.

Many etching damages by the dry-etching or the like are left in the surface of the N type semiconductor layer 1 and the P type semiconductor layer 2 that are the sidewall of the trench 3. Therefore, first, the semiconductor substrate 12 is put in a high temperature furnace to form a so-called sacrifice oxide film having a predetermined thickness on the surface of the P type semiconductor layer 2 and the N type semiconductor layer 1 that are the sidewall of the trench 3 and the etching damaged layer is absorbed therein.

Figure 3:
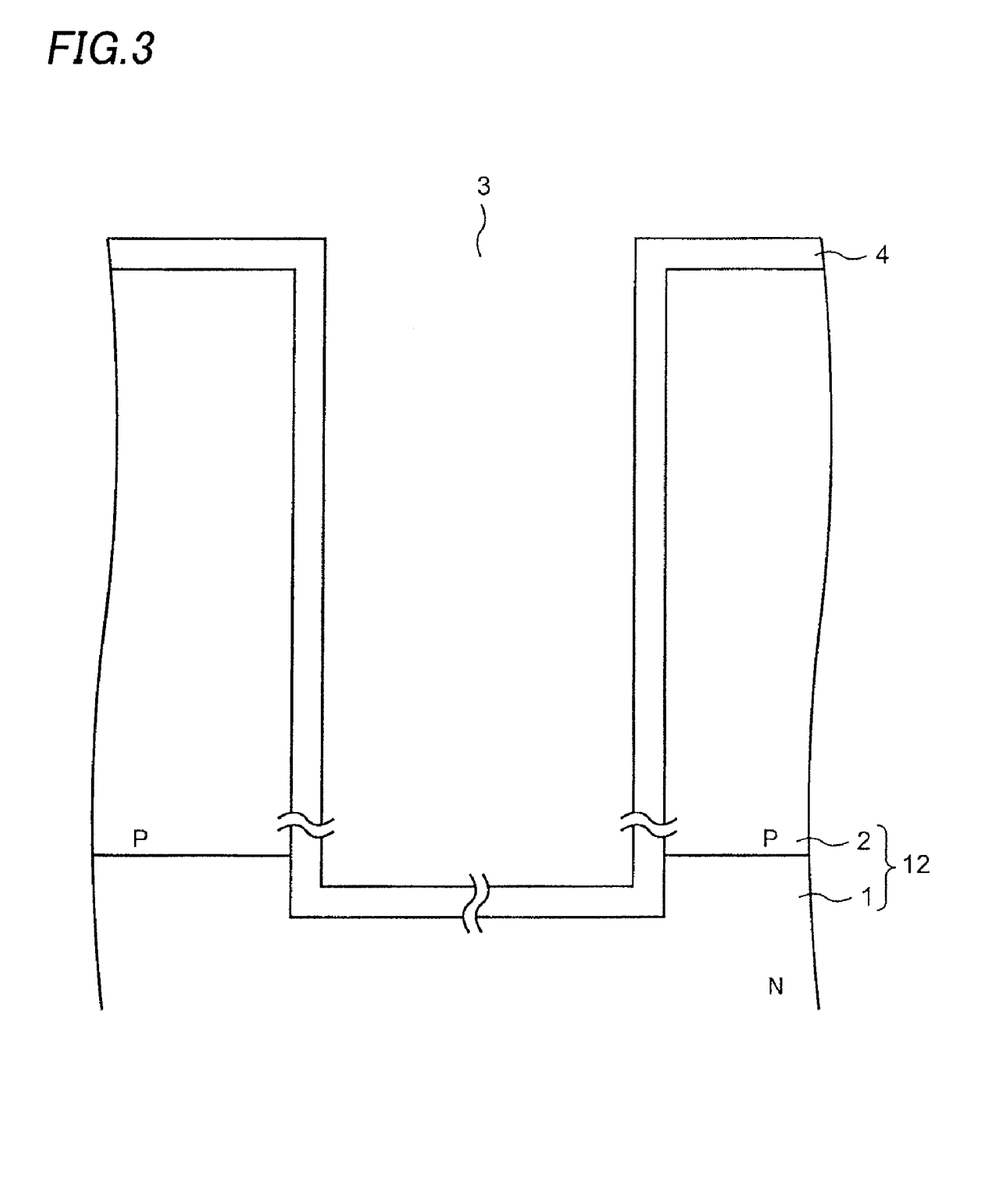

The semiconductor substrate is then immersed in an etchant such as hydrofluoric acid or the like and the sacrifice oxide film is etched and removed. Then, as shown in FIG. 3, the semiconductor substrate 12 is put in a high temperature furnace or the like to form a gate insulation film 4 having a predetermined thickness and extending from in the trench 3 onto the front surface of the P type semiconductor layer 2. It is noted that the gate insulation film 4 may be an oxynitride film formed by nitriding a silicon thermal oxide film.

Then, a polysilicon layer covering the whole front surface of the semiconductor substrate 12 including in the trench 3 is formed by a CVD method. Since the polysilicon layer is thick, the polysilicon layer fills the trench 3 and the front surface is almost flat. Phosphorus is then diffused in the polysilicon layer in a high temperature furnace using phosphorus oxychloride (POCl3) or the like as an impurity source. Then the whole surface of the polysilicon layer is etched back by dry-etching until the gate insulation film 4 on the P type semiconductor layer 2 is exposed.

Figure 4:
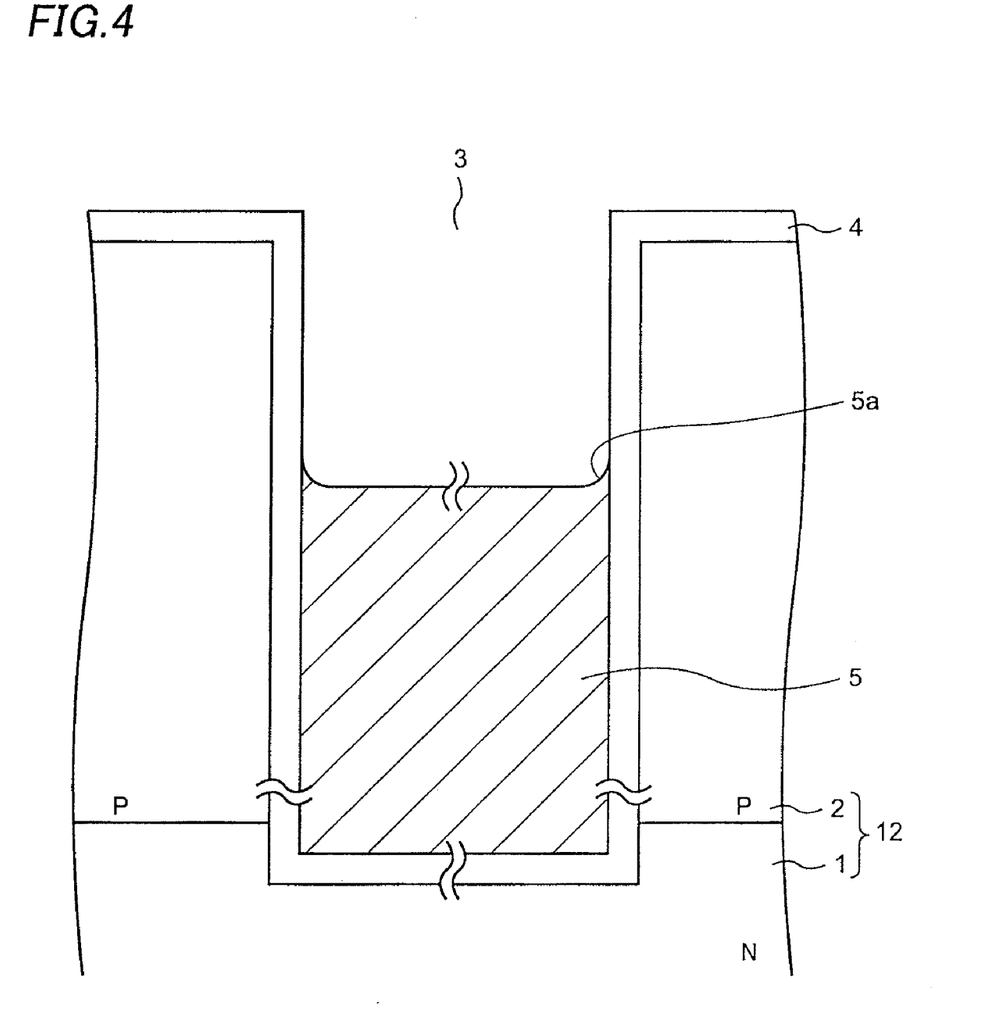

At this time, the etching state is checked by detecting the end point by an end point detector, then over-etching is performed for a predetermined time so as not to leave the residue of the polysilicon layer on the gate insulation film 4 on the P type semiconductor layer 2, thereby forming the gate electrode 5 in the trench 3 as shown in FIG. 4. A gate electrode uppermost surface 5a is observable from above the trench 3. As a result, as shown in FIG. 4, the uppermost surface 5a of the gate electrode in the trench 3 is located in a low position down from the front surface of the P type semiconductor layer 2 to a predetermined position. This embodiment is directed to preventing the insulation breakdown voltage of a portion of the gate insulation film 4 between this gate electrode 5 and the P type semiconductor layer 2 from decreasing due to damages by ion implantation of arsenic ions or the like for forming an emitter layer or the like in a subsequent process.

Figure 5:
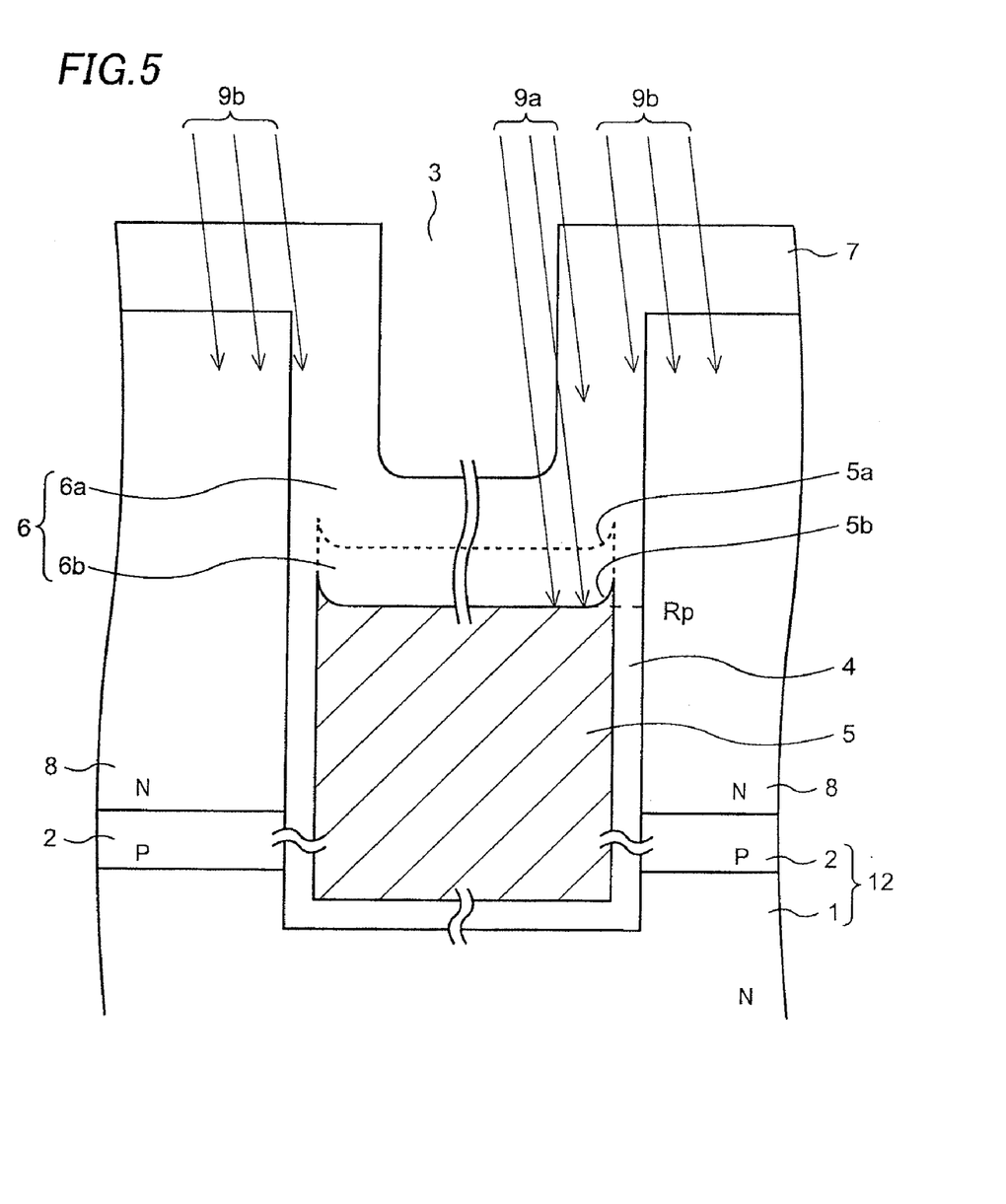

Then, as shown in FIG. 5, the semiconductor substrate 12 is put in a high temperature furnace or the like and the polysilicon film forming the gate electrode 5 is thermally oxidized to form a polysilicon thermal oxide film 6 that is thicker than the projected range Rp of arsenic ions when ion-implanted in the polysilicon thermal oxide film and serves as a protection film on the gate electrode. As shown in FIG. 5, the polysilicon thermal oxide film 6 includes an upper portion 6a and a lower portion 6b between which the gate electrode uppermost surface 5a shown by a dotted line is located before the oxidation, and a gate electrode uppermost surface 5b is newly formed.

Figure 7:
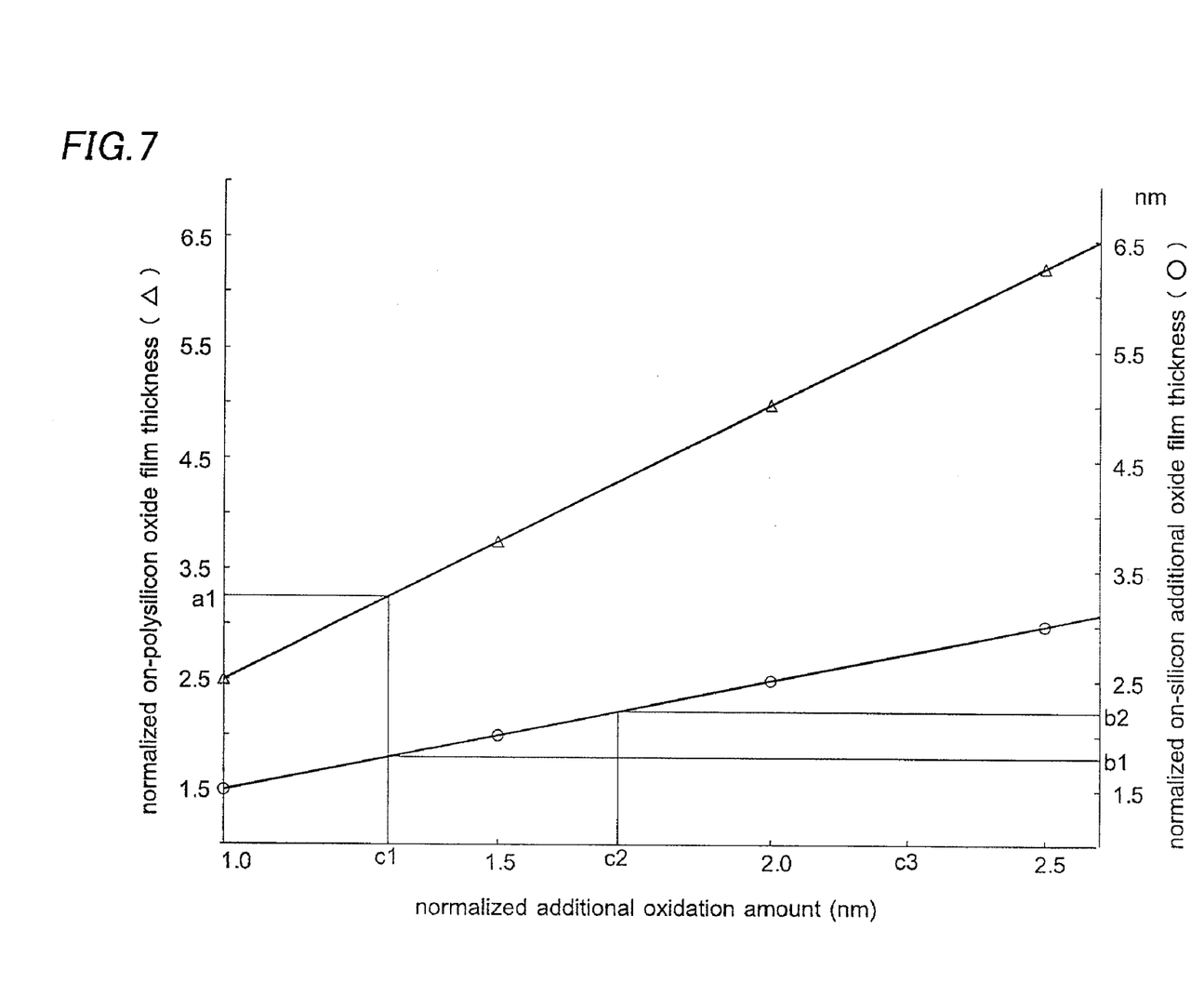
FIG. 7 is a graph showing a relation of a normalized additional oxidation amount and normalized oxide film thicknesses on polysilicon and on silicon.

At this time, the gate insulation film 4 having a predetermined thickness formed on the P type semiconductor layer 2 is also additionally oxidized by an additional oxidation amount shown in FIG. 7 at the same time, and forms a thick additional oxide film 7. The thickness of the additional oxide film 7 is less than 70% of the projected range Rp of arsenic ions. The necessity of the thickness of the described polysilicon thermal oxide film 6 and the thickness of the additional oxide film 7 will be described below.

The projected range Rp of ions means an average value of the ranges of a plurality of ions travelling in an object when the ions are ion-implanted in the object. The ion-implanted ions become neutral atoms at last and stop, forming a Gaussian distribution in the ion-implanted object. Therefore, the projected range Rp of ions means the peak position of a Gaussian distribution of impurities stopping in an object.

Then, as shown by the arrows 9b, arsenic ions or the like are ion-implanted in the P type semiconductor layer 2 at a predetermined acceleration voltage so as to form an N type semiconductor layer 8. The reason the direction of the ion implantation makes a small angle with the vertical direction to the semiconductor substrate is to prevent the implanted ions from distributing in the deeper positions irregularly than in predetermined positions in the P type semiconductor layer 2 by channeling as described above.

The arsenic ions or the like shown by the arrows 9a in FIG. 5 are implanted in the direction to a portion of the gate insulation film 4 between the gate electrode uppermost surface 5b and the P type semiconductor layer 2, the gate electrode uppermost surface 5b being located in the lower position than the gate electrode uppermost surface 5a formed at first by forming the polysilicon thermal oxide film 6 on the upper surface of the polysilicon. The implanted arsenic ions or the like do not enter the gate insulation film 4 between the gate electrode 5 and the P type semiconductor layer 2 described above, or otherwise only some of the arsenic ions travelling deeper than the projected range Rp of arsenic ions enter the gate insulation film 4 therebetween, since the polysilicon thermal oxide film 6 that is thicker than the projected range Rp of arsenic ions in the polysilicon thermal oxide film is formed on the gate electrode uppermost surface 5b newly obtained after the oxidation.

Figure 6A:
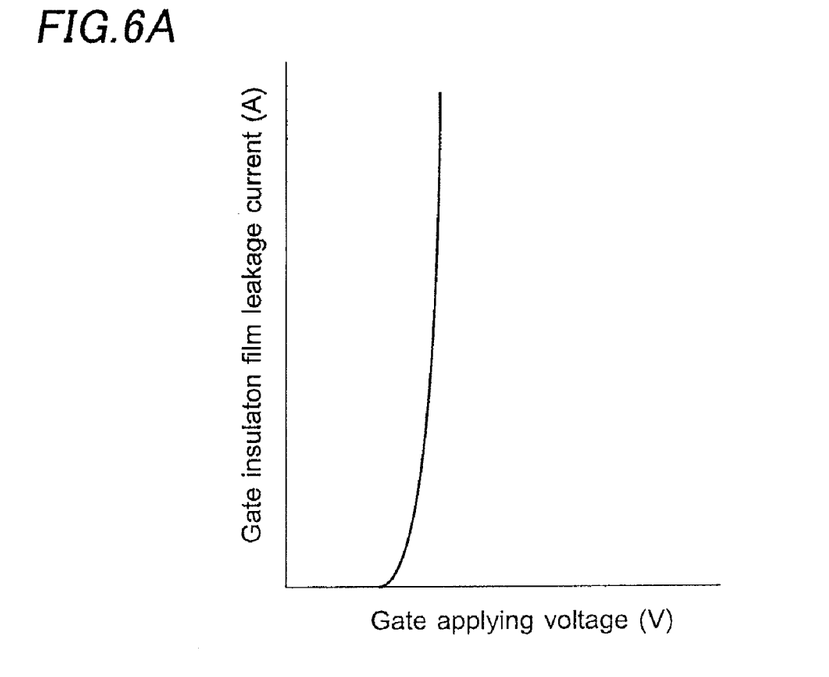
FIGS. 6A and 6B are graphs showing a relation of a gate applying voltage and a leakage current of a gate insulation film.
Figure 6B:
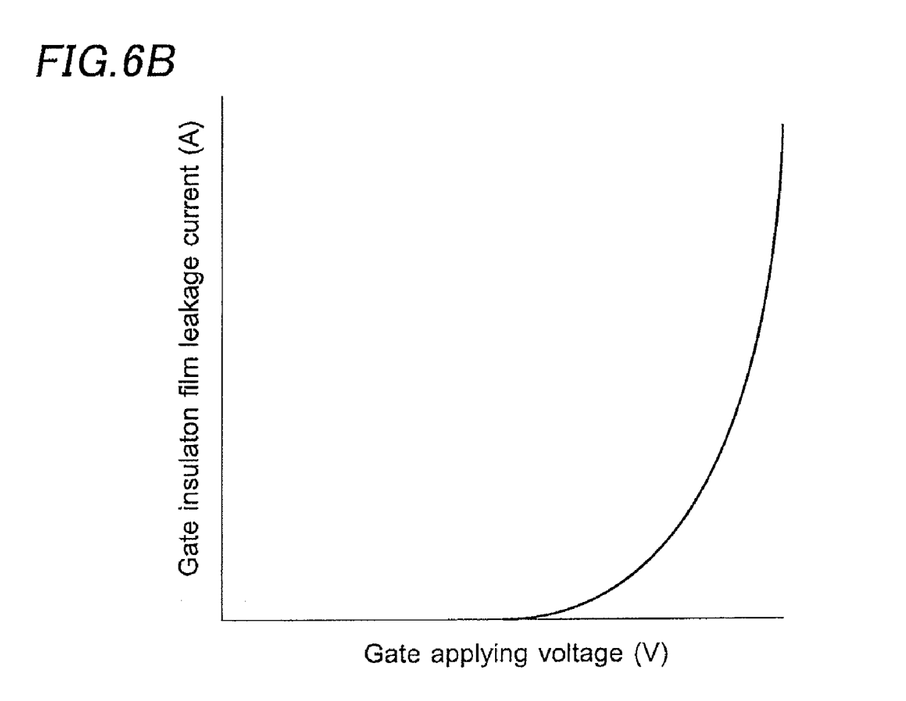

In a conventional case shown in FIG. 11, since arsenic ions are ion-implanted directly in a gate insulation film 4 between a gate electrode 5 and a P type semiconductor layer 2, the gate insulation film 4 is subjected to the impact of the arsenic ions, a gate insulation film leakage current relative to a gate applying voltage increases as shown in FIG. 6A, and the insulation breakdown voltage of the gate insulation film 4 decreases. However, in the embodiment, as described above, even if there are arsenic ions implanted in the gate insulation film 4 between the gate electrode 5 and the P type semiconductor layer 2, the amount is largely smaller than in the conventional case, and thus a high insulation breakdown voltage is obtained as shown in FIG. 6B.

Although FIGS. 5 and 11 show as if the N type semiconductor layer 8 is formed in the P type semiconductor layer 2 immediately after the ion implantation, at this time most of the arsenic ions forms a Gaussian distribution between the atomic lattice of silicon forming the P type semiconductor layer 2 in an inactive state, and the complete N type semiconductor layer 8 is not formed in the P type semiconductor layer 2. The N type semiconductor layer 8 shown in FIGS. 5 and 11 is completed by diffusion and activation by performing a high temperature annealing treatment or the like to an interlayer insulation film in a subsequent process.

Next, a description will be given about the reason for determining the thickness of the gate insulation film 4 formed on the P type semiconductor layer 2 at first and the additional oxide film 7 added with the additional oxidation amount as less than 70% of the projected range Rp of arsenic ions in the silicon oxide film. The N type semiconductor layer 8 is formed in the P type semiconductor layer 2 by the ion implantation of arsenic ions shown by the arrows 9b in FIG. 5. The N type semiconductor layer 8 serves as an emitter layer of an IGBT or serves as a source layer of a power MOS transistor, and the P type semiconductor layer 2 under these serves as a channel layer of the respective devices.

By performing an annealing treatment to an interlayer insulation film in a subsequent process, the N type semiconductor layer 8 formed by the ion implantation of arsenic ions is extended from the front surface of the P type semiconductor layer 2 into the P type semiconductor layer 2 deeper than the gate electrode uppermost surface 5b that is opposite to the P type semiconductor layer 2 through the gate insulation film 4. It is preferable that the arsenic concentration of the N type semiconductor layer 8 is high as much as possible within an actual use range so as to decrease the on-resistance and decrease the contact resistance between the N type semiconductor layer 8 and an emitter electrode or the like that contacts the N type semiconductor layer 8.

As the thickness of the additional oxide film 7 is thinner, the rate of implanted ions stopping in the additional oxide film 7 decreases, achieving the stable forming of the high concentration N type semiconductor layer 8. Since the distribution of the implanted ions belongs to a Gaussian distribution, it is preferable that the thickness of the additional oxide film 7 is less than 70% of the projected range Rp of arsenic ions in the silicon oxide film so as to stably form the high concentration N type semiconductor layer 8.

On the other hand, it is preferable that the polysilicon thermal oxide film 6 on the gate electrode 5 is formed thick so as to prevent damages to the gate insulation film 4 described above. The abscissa axis in FIG. 7 indicates an additional oxidation amount additionally formed on the front surface of the P type semiconductor layer 2 having the gate insulation film 4 having a predetermined first thickness, and the ordinate axis indicates the thickness of the additional oxide film 7 formed by adding an additional oxidation amount to the gate insulation film 4 having the predetermined first thickness on the P type semiconductor layer 2 and the thickness of the polysilicon thermal oxide film 6 formed on the gate electrode 5, that are normalized respectively, showing a relation of these. The growth speed of the oxide film on the polysilicon is higher than the growth speed of the oxide film on the silicon although influenced by the impurity concentration or the like. The utilization of this difference between these growth speeds is also an important point for obtaining preferable effects.

In the case of the acceleration voltage for the ion implantation of arsenic ions in the embodiment, the projected range Rp of arsenic ions in the polysilicon oxide film is $a1 \approx 3.25$ nm as a normalized value shown by a1 in the axis of ordinates in FIG. 7. Therefore, in order to prevent the gate insulation film 4 between the gate electrode 5 and the P type semiconductor layer 2 near the gate electrode uppermost surface 5b portion from being damaged by the ion implantation of arsenic ions, the normalized thickness of the polysilicon thermal oxide film 6 on the gate electrode uppermost surface 5b need be thicker than about 3.25 nm.

This is because a decrease of the insulation breakdown voltage of the gate insulation film 4 is observed when the polysilicon thermal oxide film 6 is formed thinner than the projected range 3.25 nm of arsenic ions in the polysilicon oxide film. In this case, the thickness of the lower portion 6b of the polysilicon thermal oxide film 6 between the gate electrode uppermost surface 5a formed at first and the gate electrode uppermost surface 5b formed next is 0.45 of the whole thickness, and the thickness of the upper portion 6a of the polysilicon thermal oxide film 6 formed over the gate electrode uppermost surface 5a formed at first is about 0.55 of the whole thickness.

In FIG. 7, when the normalized on-polysilicon oxide film thickness of the polysilicon thermal oxide film 6 on the gate electrode 5 is $a1 \approx 3.25$ nm, the normalized additional oxidation amount is $c1 \approx 41.3$ nm, and the thickness of the normalized on-silicon additional oxide film 7 on the P type semiconductor layer 2 is $b1 \approx 1.87$ nm. The projected range Rp of arsenic ions in the silicon oxide film is about 3.25 nm that is almost the same as in the case of the polysilicon oxide film. When the thickness of the normalized on-silicon additional oxide film 7 is thicker than about 2.25 nm (b2) that is 0.7 times the projected range 3.25 nm of arsenic ions in the silicon oxide film, the implantation dose of arsenic ions in the P type semiconductor layer 2 shown by the arrows 9b in FIG. 5 decreases, the resistance of the N type semiconductor layer 8 increases, and the front surface concentration decreases to increase the contact resistance with an emitter electrode or the like (not shown).

Figure 8:
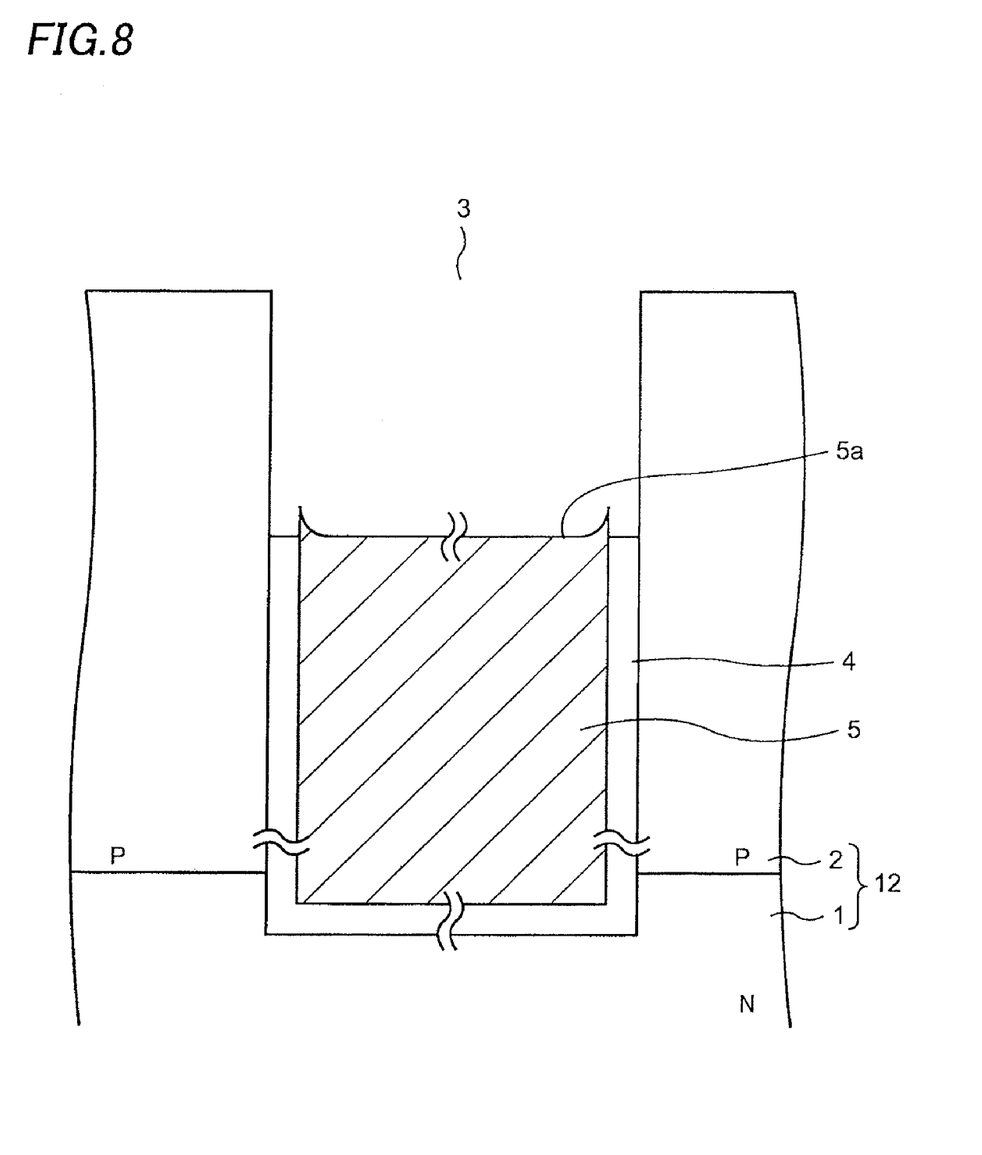
FIGS. 8 and 9 are cross-sectional views showing a method of manufacturing a semiconductor device of a second embodiment of the invention.

A second embodiment of the invention will be described referring to FIGS. 8 and 9. The same numerals are given to the same components as those of the first embodiment. First, a semiconductor substrate 12 shown in FIG. 4 is provided through the same processes as those of the first embodiment. Then, as shown in FIG. 8, a gate insulation film 4 exposed on a P type semiconductor layer 2 is etched and removed. At this time, a portion of the gate insulation film 4 between a gate electrode 5 and the P type semiconductor layer 2 is also slightly etched like caved.

Figure 9:
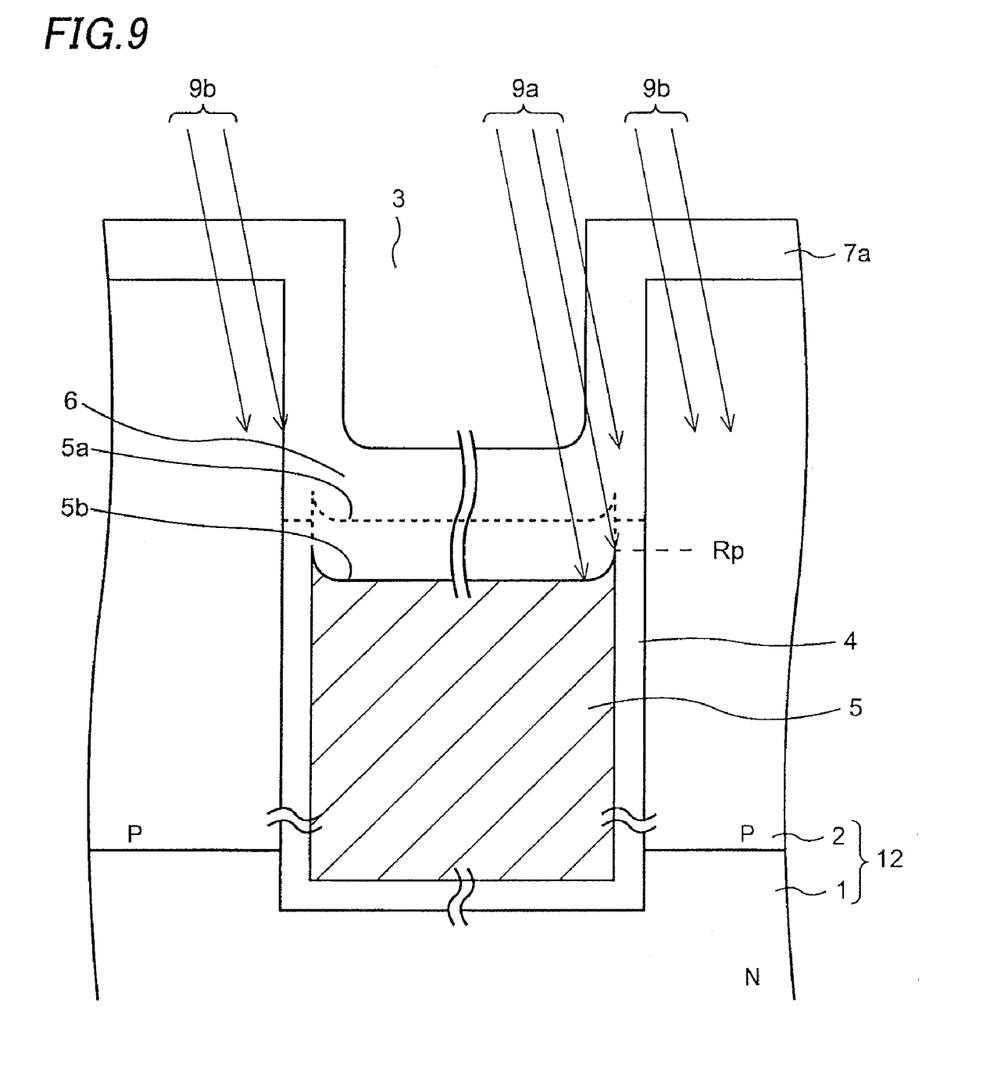

Then, as shown in FIG. 9, the semiconductor substrate 12 is put in a high temperature furnace, and a polysilicon thermal oxide film 6 is foamed on the gate electrode 5 and an additional oxide film 7a is formed on the P type semiconductor layer 2 under the same condition as that of the first embodiment. In this case, the thickness of the polysilicon oxide film 6 formed on the gate electrode 5 is the same as in the case of the first embodiment.

On the other hand, with the same additional oxidation amount, since the thickness is 0 on the P type semiconductor layer 2 at first, the additional oxide film 7a formed on the P type semiconductor layer 2 is smaller than the thickness of the additional oxide film 7 in the first embodiment starting from a predetermined thickness at first. Although not exactly, the thickness of the normalized on-silicon additional oxide film 7a made of a silicon thermal oxide film formed on the exposed P type semiconductor layer 2 in the embodiment is equal to the normalized additional oxidation amount.

The lower limits of the thicknesses of the additional oxide film 7 and the additional oxide film 7a are limited by the minimum thickness of the polysilicon thermal oxide film 6 that is enough to prevent damages due to the ion implantation, and the upper limits are limited by the concentration of the N type semiconductor layer 8 or the like. The allowable ranges are compared using the normalized additional oxidation amount in FIG. 7 of the first embodiment. In both the first embodiment and second embodiment, the lower limit of the normalized additional oxidation amount is $c1 \approx 1.3$ nm that corresponds to the thickness of the normalized on-polysilicon oxide film of $a1 \approx 43.25$ nm and the same.

On the other hand, in the first embodiment, the upper limit of the normalized additional oxidation amount is $c2 \approx 41.72$ nm that corresponds to the upper limit $b2 \approx 42.25$ nm of the thickness of the normalized on-silicon additional oxide film. In this embodiment, since the normalized additional oxidation amount itself corresponds to the thickness of the normalized on-silicon additional oxide film on the P type semiconductor layer 2, an upper limit $c3$ of the thickness of the normalized on-silicon additional oxide film is 0.7 times the projected range 3.25 nm of arsenic ions in the silicon oxide film, i.e., $c3 \approx 42.25$ nm. As a result, the allowable range of the normalized additional oxidation amount in the first embodiment is $c1$ to $c2$, i.e., 1.3 to 1.72 nm, while the allowable range of the normalized additional oxidation amount in this embodiment is $c1$ to $c3$, i.e., 1.3 to 2.25 nm. As a result, the allowable range of the additional oxidation amount becomes 2.2 times or more wider. Since the normalized additional oxidation amount is proportional to the oxidation time to the one-half power, the time to the upper limit of the normalized additional oxidation amount in this embodiment is about 1.8 times longer compared with the first embodiment.

In other words, in the case of the first embodiment, since the heat treatment time width between the upper limit and the lower limit for forming the allowable normalized additional amount is small and the process allowance is low, the variation need be solved such as by decreasing the number of substrates to be treated one time. On the other hand, in this embodiment, since the time to the upper limit of the allowable normalized additional oxidation amount is extended about 1.8 times compared with the first embodiment, the process allowance is largely enhanced.

Next, the features of the invention common to the first and second embodiments (hereafter, referred to as the embodiments) will be described, which the conventional art described in the Japanese Patent Application publication No. 2000-349289 does not have. The first feature is that the capability of implantation of impurity ions in the P type semiconductor layer 2 from the sidewall of the trench 3. In the first embodiment described in the Japanese Patent Application publication No. 2000-349289, the whole surface of a semiconductor substrate 12 including in a trench 3 is covered by an almost flat thick silicon oxide film, and the sidewall of the trench 3 is not exposed. Therefore, arsenic ions or the like are ion-implanted in a P type semiconductor layer 2 only from the upper surface of the P type semiconductor layer 2, and not from the sidewall of the trench 3.

Furthermore, in the third embodiment described in the Japanese Patent Application publication No. 2000-349289, the sidewall of the trench 3 that is exposed in the exposed portion of the trench 3 of which the uppermost portion is exposed is covered by a thick film made of a CVD oxide film, a gate oxide film and a screen oxide film, and thus arsenic ions or the like are not ion-implanted from the sidewall of the trench 3.

On the other hand, in the embodiments, since the upper surface of the polysilicon oxide film 6 on the gate electrode 5 is formed lower than the upper surface of the P type semiconductor layer 2, a part of the trench 3 is exposed although the sidewall of the trench 3 is covered by the additional oxide film 7 or the additional oxide film 7a. Therefore, as well as from the upper surface of the P type semiconductor layer 2, some of arsenic ions or the like implanted in the directions of the arrows 9a and between the arrows 9a and the arrows 9b are implanted in the P type semiconductor layer 2 from the sidewall of the trench 3 through the additional oxide film 7 or the additional oxide film 7a, or the like.

Since an injection portion of the additional oxide film 7 or the additional oxide film 7a where arsenic ions or the like are injected in the direction of the arrows 9a or the direction between the arrows 9a and the arrows 9b is located lower than an injection portion of the additional oxide film 7 or the additional oxide film 7a on the P type semiconductor layer 2 where arsenic ions are injected in the direction of the arrows 9b, arsenic ions or the like injected from the sidewall of the trench 3 are distributed in the deeper positions of the P type semiconductor layer 2 than conventional. As a result, the device characteristics or the like is enhanced. Since this position becomes deeper as the thickness of the additional oxide film 7 or the like is thinner, the second embodiment is more advantageous than the first embodiment.

However, arsenic ions or the like injected in the directions of the arrows 9a or the directions between the arrows 9a and the arrows 9b obliquely travel in the additional oxide film 7 or the additional oxide film 7a formed on the sidewall of the trench 3. Therefore, even when the thickness of the normalized on-silicon additional oxide film 7a is $c1 \approx 1.3$ nm that corresponds to the thickness $a1 \approx 43.25$ nm of the normalized on-polysilicon oxide film, for example, arsenic ions or the like are implanted in the P type semiconductor layer 2 after travelling about 10.6 nm in the on-silicon normalized additional oxide film. As a result, the concentration of arsenic or the like implanted in the P type semiconductor layer 2 becomes low.

Therefore, for obtaining the effect described above, it is necessary to determine the distance between the uppermost surface of the polysilicon oxide film 6 and the upper surface of the P type semiconductor layer 2, taking into account of that the projected range Rp of arsenic ions in the silicon is about 1.2 times the projected range Rp of arsenic ions in the silicon oxide film.

Figure 10:
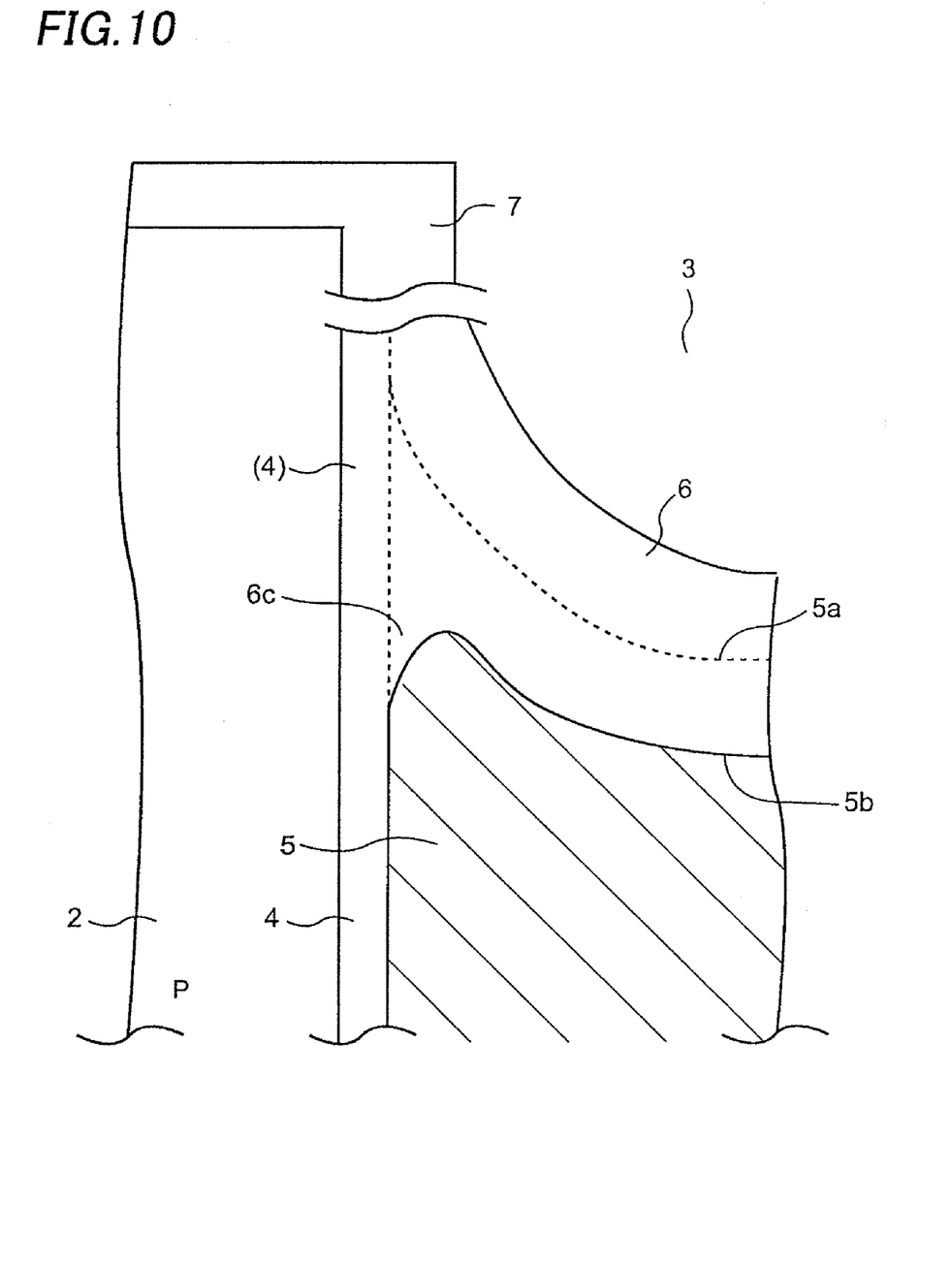
FIG. 10 is an enlarged cross-sectional view of a portion near the uppermost surface of a gate electrode, showing the method of manufacturing the semiconductor device of the embodiments of the invention.

Next, the second feature will be described referring to FIG. 10. FIG. 10 shows a positional relation in a portion near the gate electrode uppermost surface 5b and the gate insulation film 4 in a microstate. When the gate electrode 5 is oxidized to form the polysilicon oxide film 6 on the gate electrode 5, near the gate electrode uppermost surface 5a contacting the gate insulation film 4, the polysilicon is oxidized and the P type semiconductor layer 2 is also simultaneously oxidized by oxidizing species passing through the gate insulation film 4.

As a result, the gate electrode uppermost surface 5b forms a mountain shape of which the height increases as the distance from the P type semiconductor layer 2 increases to the topmost portion and then decreases toward the center portion of the trench 3. Furthermore, a thick mixed insulation film 6c where a thermal oxide film of the P type semiconductor layer and a thermal oxide film of the polysilicon are mixed is formed between the P type semiconductor layer 2 and the gate electrode uppermost surface 5b, of which the thickness increases toward the topmost portion of the gate electrode uppermost surface 5b from the gate insulation film having a predetermined thickness.

On the other hand, the gate insulation film 4 between the gate electrode uppermost surface 5a and the P type semiconductor layer 2 and the front surface of the P type semiconductor layer 2 immediately under this gate insulation film 4 may be damaged by the etching, and the damages may still remain. In this case, as described above, the etched and damaged P type semiconductor layer 2 opposite to the gate electrode uppermost surface 5b through the gate insulation film 4 becomes a part of the newly formed mixed insulation film 6c, and the damaged layer in the P type semiconductor layer 2 is absorbed and removed. Furthermore, since the mixed insulation film 6c of which the thickness gradually increases toward the gate electrode uppermost surface 5b is formed, the field strength between the gate electrode uppermost surface 5b and the P type semiconductor layer 2 opposite to the gate electrode uppermost surface 5b is moderated, thereby preventing an increase of a leakage current between these.

Finally, the third feature will be described. After the process of ion implantation of arsenic or the like is completed, an interlayer insulation film is deposited on the whole surface of the semiconductor substrate 12 by a CVD method or the like. The interlayer insulation film is generally formed by depositing a non-doped silicon oxide film NSG and a boron and phosphorus doped silicon oxide film BPSG in order. In this embodiment, since the polysilicon thermal oxide film 6 and the additional oxide film 7 that are thicker than conventional are formed on the gate electrode 5 and on the N type semiconductor layer 8, it is also possible to form the BPSG directly without forming the NSG layer.

After then, contact holes are formed in the interlayer insulation film by a predetermined process, an emitter electrode and the like are formed by a predetermined process, and finally a passivation film made of a nitride film or the like is formed, thereby completing a semiconductor device. This manner further decreases the number of processes, and realizes the manufacturing of a semiconductor device at low cost, of which the insulation breakdown voltage of the gate insulation film is enhanced as described above.

Although the description is given about an N-channel type power MOS transistor, in a case of a P channel type power MOS transistor, the fundamental portion is the same except that the polarities of the impurities of the first and second embodiments are reversed.

A method of manufacturing a semiconductor device of the invention realizes manufacturing a semiconductor device at low cost, of which the insulation breakdown voltage of the gate insulation film is enhanced.

What is claimed is:

1. A method of manufacturing a semiconductor device, comprising:
    providing a semiconductor substrate comprising a first semiconductor layer of a first general conductive type and a second semiconductor layer of a second general conductive type disposed on the first semiconductor layer;
    forming a trench extending from a front surface of the second semiconductor layer into the first semiconductor layer;
    forming a gate insulation film on an inner sidewall of the trench and the front surface of the second semiconductor layer;
    forming a gate electrode in the trench after the formation of the gate insulation film;
    forming a gate electrode protection film on an upper surface of the gate electrode by thermally oxidizing the gate electrode; and
    forming an impurity region of the first general conductive type by ion-implanting impurity ions in the second semiconductor layer after the formation of the gate electrode protection film,
    wherein a thermal oxide film is formed on the upper surface of the second semiconductor layer so as to overlap the gate insulation film during the formation of the gate electrode protection film, a thickness of the gate electrode protection film is larger than a projected range of the impurity ions in the gate electrode protection film during the formation of the impurity region, and a total thickness of the overlapped gate insulation film and thermal oxide film is less than 70% of the projected range of the impurity ions in the gate electrode protection film.

2. The method of claim 1, wherein an upper surface of the gate electrode protection film is lower than the upper surface of the second semiconductor layer.

3. The method of claim 1, wherein the gate insulation film between the gate electrode and the second semiconductor layer is thicker at an uppermost surface of the gate electrode than at a lower part of the gate electrode.

4. The method of claim 3, wherein the uppermost surface of the gate electrode adjacent the second semiconductor layer has a mountain shape which has a maximum height away from the gate insulation film so that a height thereof decreases toward a center portion of the trench, and a thickness of the gate insulation film between the second semiconductor layer and the gate electrode gradually increases toward the uppermost surface of the gate electrode.

5. A method of manufacturing a semiconductor device, comprising
    providing a semiconductor substrate comprising a first semiconductor layer of a first general conductive type and a second semiconductor layer of a second general conductive type disposed on the first semiconductor layer;

forming a trench extending from a front surface of the second semiconductor layer into the first semiconductor layer;

forming a gate insulation film on an inner sidewall of the trench and the front surface of the second semiconductor layer;

forming a gate electrode in the trench after the formation of the gate insulation film;

forming a gate electrode protection film on an upper surface of the gate electrode by thermally oxidizing the gate electrode;

forming an impurity region of the first general conductive type by ion-implanting impurity ions in the second semiconductor layer after the formation of the gate electrode protection film; and removing the gate insulation film from the front surface of the second semiconductor layer after the formation of the gate electrode and before the formation of the gate electrode protection film.

* * * * *